United States Patent
Urban et al.

(10) Patent No.: US 7,073,414 B2
(45) Date of Patent: *Jul. 11, 2006

(54) APPARATUS FOR ACCESSING TELECOMMUNICATIONS NETWORKS

(75) Inventors: Blake R. Urban, Lenior, NC (US);
Isaac D. M. White, Orlando, FL (US);
James E. Dickens, Ocoee, FL (US);
Kevin Forsberg, Orlando, FL (US);
Charles Sawyer, Orlando, FL (US)

(73) Assignee: BellSouth Intellectual Property Corporation, Wilmington, DE (US)

( * ) Notice: Subject to any disclaimer, the term of this patent is extended or adjusted under 35 U.S.C. 154(b) by 228 days.

This patent is subject to a terminal disclaimer.

(21) Appl. No.: 10/326,688

(22) Filed: Dec. 20, 2002

(65) Prior Publication Data

US 2004/0119456 A1 Jun. 24, 2004

(51) Int. Cl.
*B25F 1/00* (2006.01)

(52) U.S. Cl. ............................ 81/437; 81/439; 81/63.1

(58) Field of Classification Search ............... 324/72.5, 324/96, 207, 326–329, 426, 427, 166, 207.2, 324/207.25, 158.1; 81/437, 439, 960, 177.85, 81/125.1, 63.1; 128/899
See application file for complete search history.

(56) References Cited

U.S. PATENT DOCUMENTS

| | | | |
|---|---|---|---|
| 3,337,801 A | 8/1967 | Rinier | |
| 3,724,561 A * | 4/1973 | Merrels | 173/50 |
| 3,828,256 A | 8/1974 | Liu | |
| 4,724,382 A | 2/1988 | Schauerte | |
| 4,736,480 A | 4/1988 | Bohl | |
| 5,369,363 A | 11/1994 | Hey | |
| 5,619,890 A * | 4/1997 | Hattori et al. | 81/59.1 |
| 5,685,761 A | 11/1997 | Schepens | |
| 6,100,679 A | 8/2000 | McCasland | |
| 6,157,184 A | 12/2000 | Atherton | |
| 6,259,243 B1 | 7/2001 | Lundquist | |
| 6,286,397 B1 * | 9/2001 | Taggart et al. | 81/63.1 |
| 6,705,183 B1 * | 3/2004 | Dickens | 81/437 |
| 2003/0066538 A1 * | 4/2003 | Martinelli et al. | 128/899 |

* cited by examiner

*Primary Examiner*—Vinh Nguyen
*Assistant Examiner*—Jimmy Nguyen
(74) *Attorney, Agent, or Firm*—Walters & Zimmerman; Geoff Sutcliffe; Jennifer Pearson Medlin

(57) ABSTRACT

An apparatus is disclosed for accessing a Network Interface Device of a telecommunications network. The apparatus has a main body and a wrench. The main body has a first end, a second end, and an interior cavity. The interior cavity is open at the first end and extends into an interior region of the main body. The interior cavity is bound by a side wall and terminates within the main body at an end wall. The wrench is a 216-Type can wrench extending from the second end of the main body. The 216-Type can wrench has a thin-walled, polygonally-shaped interior cross-section.

9 Claims, 4 Drawing Sheets

APPARATUS FOR ACCESSING TELECOMMUNICATIONS NETWORKS

NOTICE OF COPYRIGHT PROTECTION

A portion of the disclosure of this patent document and its figures contain material subject to copyright protection. The copyright owner has no objection to the facsimile reproduction by anyone of the patent document or the patent disclosure, but the copyright owner otherwise reserves all copyrights whatsoever.

BACKGROUND OF THE INVENTION

1. Field of the Invention

This invention generally relates to electrical communications and, more particularly, to electric field detectors.

2. Description of the Related Art

High-voltages may be lethal when contacted. Electrical transmission lines transmit high voltages. If a person contacts an electrical transmission line, the person could be subjected to a lethal voltage. Telecommunications technicians, cable technicians, construction crews, and other persons are frequently in the vicinity of high voltage power lines, regional power stations, and local substations. These people must take precautions to avoid lethal contact with high voltages.

These persons, then, often use a high-voltage detector. A voltage detector senses an electrical field in the vicinity of the person or in the vicinity of a work area. These voltage detectors warn the person of dangerous, high-voltages in the vicinity. These voltage detectors typically provide an audible and/or visual warning of the dangers voltage. These previous voltage detectors, however, have limited utility. The prior art voltage detectors only sense voltages. Technicians must often carry several pieces of equipment that perform several functions. While the voltage detector is important, life-saving equipment, sometimes a technician cannot carry all the necessary equipment. If the voltage detector could perform multiple functions, the utility of the voltage detector would be improved. There is, accordingly, a need for an improved voltage detector that performs multiple functions.

BRIEF SUMMARY OF THE INVENTION

The aforementioned problems, and other problems, are reduced by an apparatus for accessing terminals and Network Interface Devices of a telecommunications network. This invention is a sleeve that slides over the outer housing of a voltage detector. The sleeve includes sockets that allow a technician to access the terminals and Network Interface Devices. The technician, or other user, slides this invention onto the voltage detector. The technician uses the voltage detector to ensure no dangerous electric fields are present within the terminal and/or the Network Interface Device. The technician then uses the sleeve of this invention, with the attached socket, to open the terminal and/or the Network Interface Device. This invention, then, improves the utility of the voltage detector by allowing the voltage detector to perform multiple functions. This invention also quickly and safely allows the technician to check for dangerous voltages before accessing the terminal and/or the Network Interface Device.

One embodiment of this invention describes an apparatus for accessing a Network Interface Device of a telecommunications network. The apparatus has a main body and a wrench. The main body has a first end, a second end, and an interior cavity. The interior cavity is open at the first end and extends into an interior region of the main body. The interior cavity is bound by a side wall and terminates within the main body at an end wall. The wrench is a 216-Type can wrench extending from the second end of the main body. The 216-Type can wrench has a thin-walled, polygonally-shaped interior cross-section that permits access to Network Interface Devices in the telecommunications network.

Another embodiment of this invention also describes an apparatus for accessing a Network Interface Device of a telecommunications network. This embodiment has a main body and a security wrench. The main body has a first end, a second end, and an interior cavity. The interior cavity is open at the first end and extends into an interior region of the main body. The interior cavity is bound by a side wall and terminates within the main body at an end wall. The security wrench extends from the second end of the main body, and the security wrench is for engaging a fastener at a demarcation point of the telecommunications network.

Still another embodiment of this invention describes a sleeve for a voltage detector. The sleeve comprises a main body and a 216-Type can wrench. The main body has a first end, a second end, and an interior cavity. The interior cavity is open at the first end and extends into an interior region of the main body. The interior cavity is bound by a side wall and terminates within the main body at an end wall. The interior cavity is adapted to slide onto a substantially non-sensing portion of a voltage detector. A thin-walled 216-Type can wrench extends from the second end of the main body, and the can wrench is for accessing Network Interface Devices in the telecommunications network.

Yet another embodiment of this invention describes an apparatus for sensing electromagnetic fields. An electromagnetic sensor is disposed in a housing. The electromagnetic sensor senses an electromagnetic field. A sleeve is adapted to slide onto the housing. The sleeve comprises a main body having a first end, a second end, and an interior cavity. The interior cavity is open at the first end and extends into an interior region of the main body. The interior cavity is bound by a side wall and terminates within the main body at an end wall. The interior cavity is adapted to slide onto and over the housing. A socket extends from the second end of the main body of the sleeve, and the socket has a polygonally-shaped interior cross-section.

BRIEF DESCRIPTION OF THE SEVERAL VIEWS OF THE DRAWINGS

These and other features, aspects, and advantages of this invention are better understood when the following Detailed Description of the Invention is read with reference to the accompanying drawings, wherein.

DETAILED DESCRIPTION OF THE INVENTION

Figure 1:
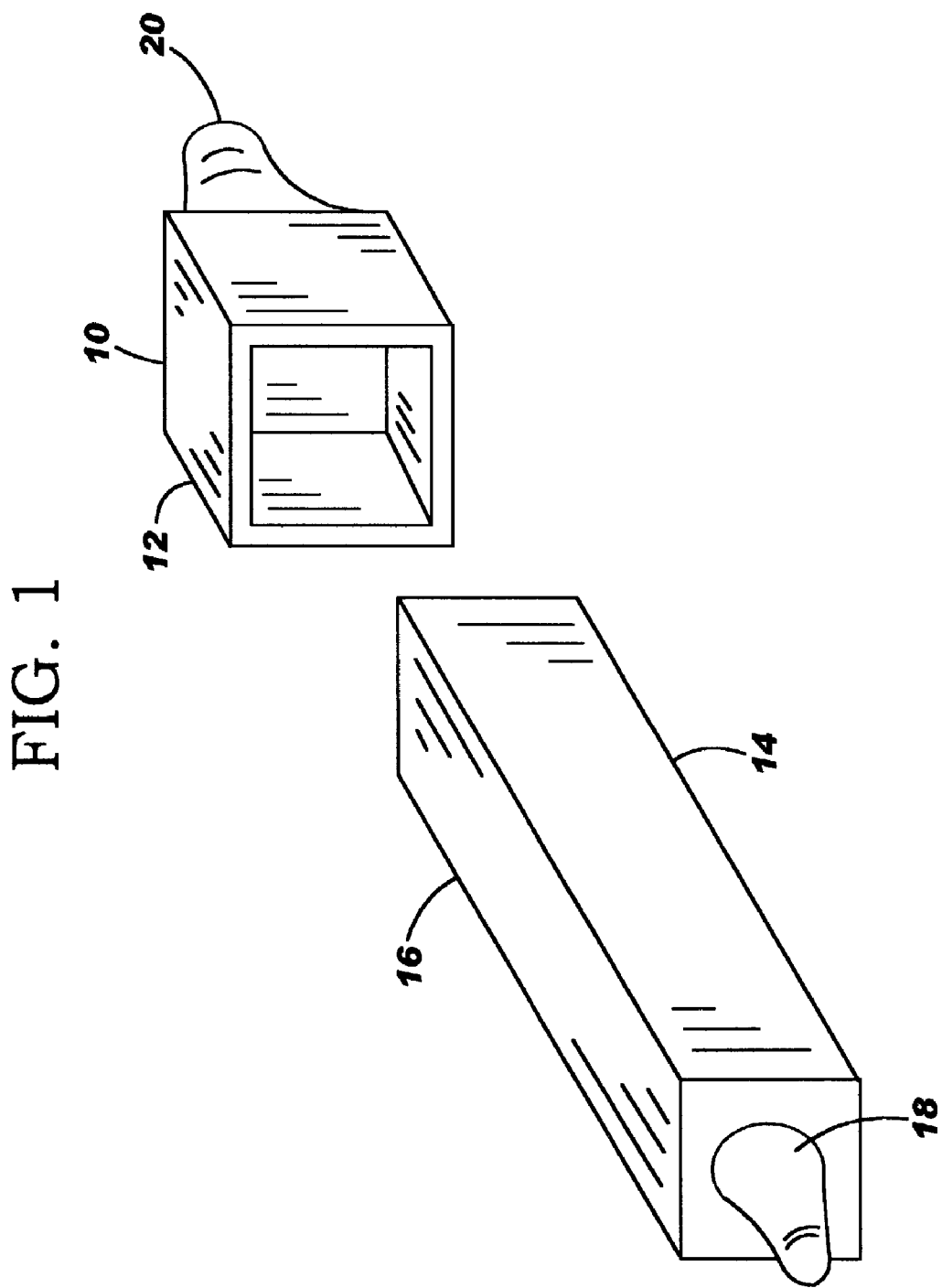
FIG. 1 is a schematic illustrating an apparatus according to this invention.

FIG. 1 is a schematic illustrating an apparatus 10 according to this invention. The apparatus 10 resembles a sleeve 12 adapted to slide onto a housing 14 of an electromagnetic detector 16. The electromagnetic detector 16 comprises an electromagnetic sensor 18 disposed in the housing 14. The electromagnetic sensor 18 senses an electromagnetic field in the vicinity of the sensor 18. The sleeve 12 includes a socket 20 extending from the sleeve 12. Once the electromagnetic detector 16 detects no dangerous electromagnetic fields are present in the work area, a user may "flip" the electromagnetic detector 16 and use the socket 20 as a tool to remove threaded bolts. The sleeve 12 slides onto the electromagnetic detector 16 and, thus, transforms the electromagnetic detector 16 into a multipurpose tool.

Figure 2:
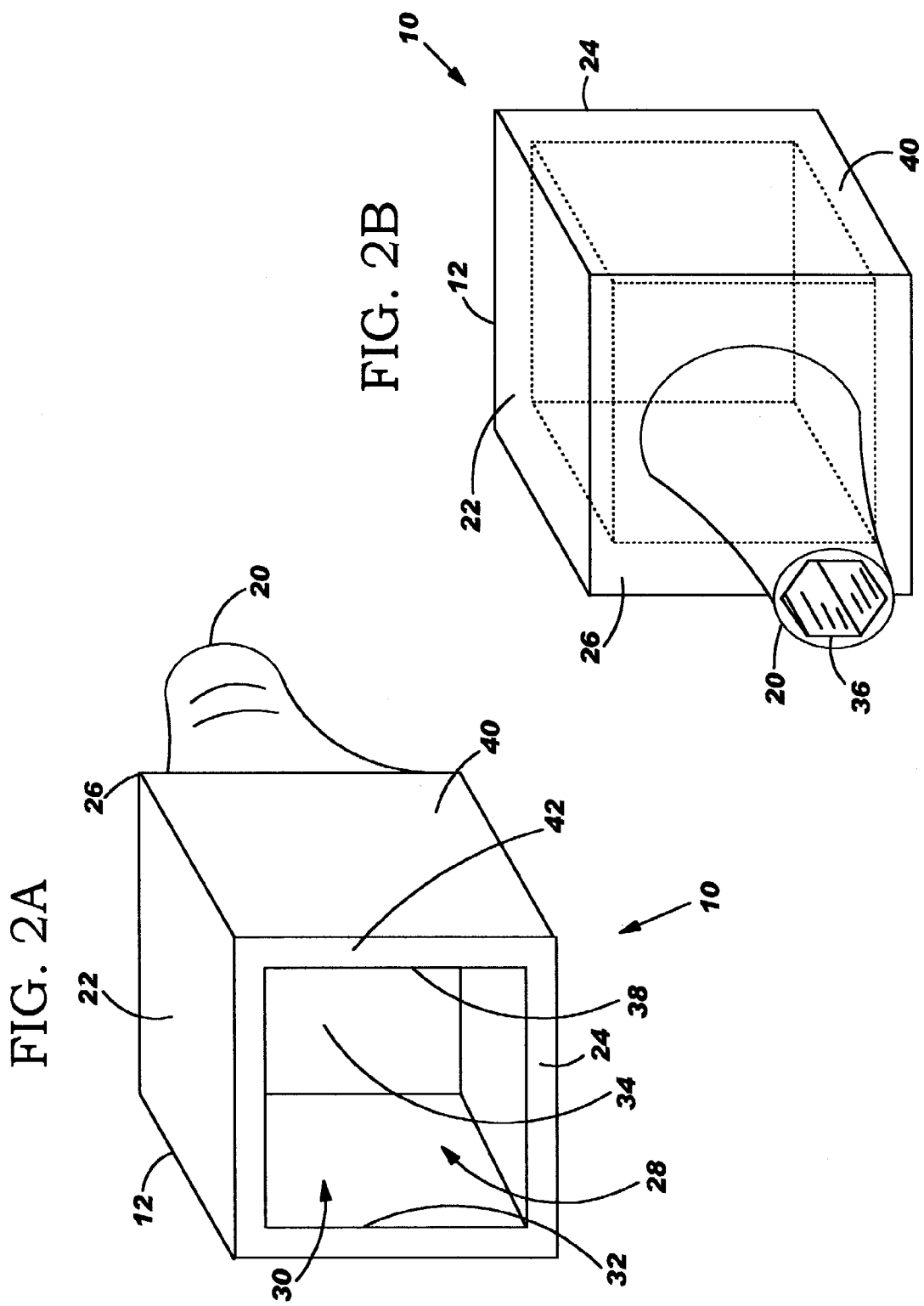
FIG. 2 is a schematic of the apparatus shown in FIG. 1.

FIGS. 2A and 2B are schematics illustrating the apparatus 10 shown in FIG. 1. The sleeve 12 comprises a main body 22 and the socket 20 extending from the main body 22. The main body 22 has a first end 24, a second end 26, and an interior cavity 28. The interior cavity 28 is open at the first end 24 and extends into an interior region 30 of the main body 22. The interior cavity 28 is bound by a side wall 32 and terminates within the main body 22 at an end wall 34. The socket 20 extends from the second end 26 of the main body 22. As FIG. 2B best shows, the socket 20 has a thin-walled, polygonally-shaped interior cross-section 36. The socket 20 is preferably a 216-Type "can wrench" that permits access to Network Interface Devices in a telecommunications network. The 216-Type can wrench is a hex-head socket with a reduced outside diameter. The 216-Type can wrench has either a ⅜-inch inside nominal diameter or a ⁷⁄₁₆-inch inside nominal diameter. Although the apparatus 10 is heretofore unavailable, can wrenches are commercially available (see, e.g., tool No. F003200 and tool No. F003205 available from Marconi plc, 1000 Marconi Drive, Warrendale, Pa. 15086-7502, 1-866-627-2664, www.marconi.com, and tool No. 19195 available from Stanley-Proto Industrial Tools, 14117 Industrial Park Blvd. NE, Covington, Ga. 30014 USA, 770-787-3800, www.stanleyproto.com).

FIGS. 2A and 2B also show additional details of the apparatus 10. The side wall 32 is shown as having a rectangular shape, thus defining a rectangularly-shaped cross-section 38 of the interior cavity 28. An outer surface 40 of the main body 22 extends from the first end 24 to the second end 26, and the outer surface 40 has a rectangular cross-section 42. While the interior cavity 28 is shown with the rectangularly-shaped cross-section 38, the interior cavity may have any desired cross-sectional shape that slides over and onto the electromagnetic detector 16. Although the outer surface 40 of the main body 22 is also shown with a rectangular cross-section 42, the outer surface 40, likewise, may have any desired cross-sectional shape.

Figure 3:
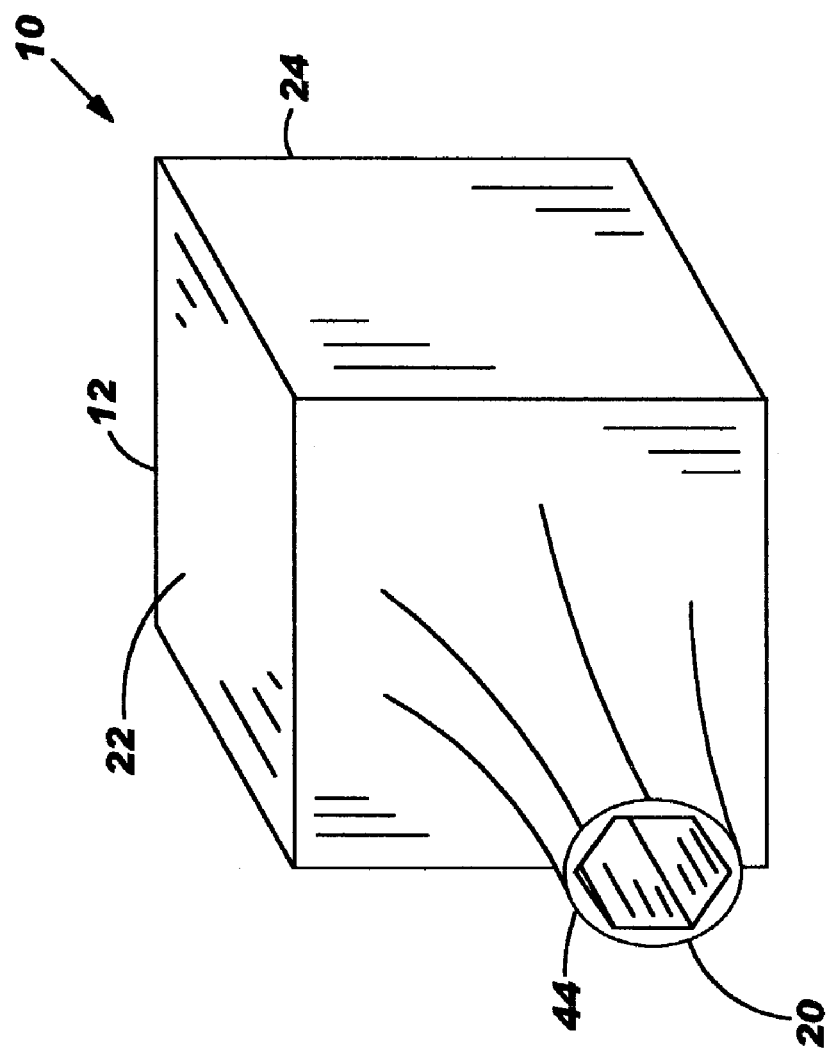
FIG. 3 is a schematic showing another embodiment of this invention.

FIG. 3 is a schematic showing another embodiment of this invention. Here the socket 20, extending from the main body 22, is a security wrench 44 for engaging a fastener at a demarcation point of a telecommunications network. As those of ordinary skill in the art recognize, the security wrench 44 is used to open and close a Network Interface Device (not shown) of a telecommunications network. The Network Interface Device typically represents a demarcation point within the telecommunications network. The Network Interface Device separates the telecommunications service provider's responsibilities from the customer's inside wiring. The security wrench 44 engages a specialty fastener in the Network Interface Device. This specialty fastener helps prevent the customer from tampering with wires and connections that are the responsibility of the service provider. The specialty fastener resembles an ordinary Allen hex-head screw, however, this specialty fastener has a center post in the hex-head. An Allen head key/wrench, therefore, cannot be inserted into the head of the specialty fastener.

Figure 4:
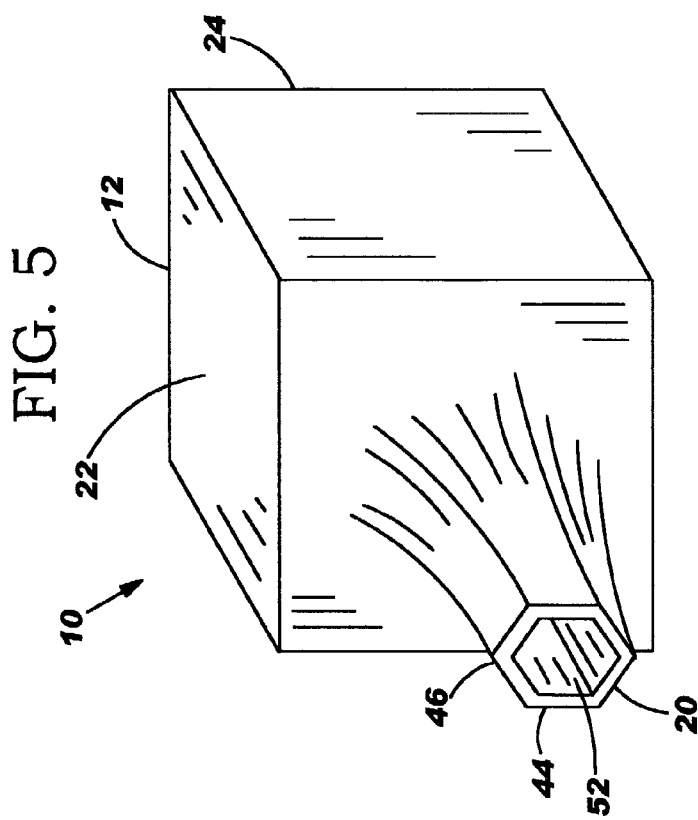
FIGS. 4 and 5 are schematics showing additional details of the embodiment shown in FIG. 3.
Figure 5:
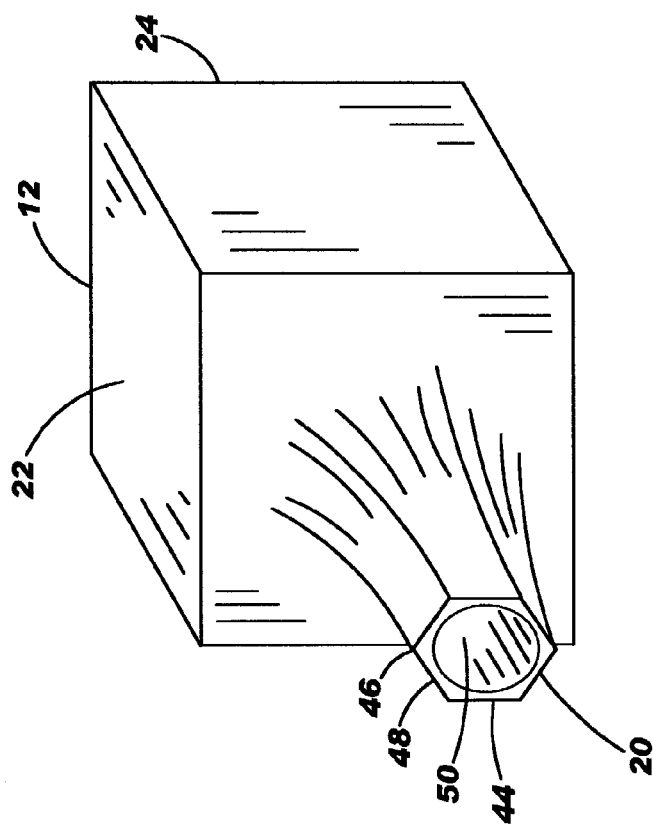

FIGS. 4 and 5 are schematics showing some details of the security wrench 44 shown in FIG. 3. The security wrench 44, however, is shown enlarged for clarity. The security wrench 44 is a thin-walled socket 46. The security wrench 44, however, has a hexagonally-shaped exterior 48. FIG. 4 illustrates the security wrench 44 could have a smoothly bored interior cross section 50. This smooth-bored interior cross section 50 accepts the center post in the head of the specialty fastener. FIG. 5, however, illustrates the security wrench 44 may also have a polygonally-shaped interior cross section 52 to accept the center post in the head of the specialty fastener.

This invention is applicable to more devices than electromagnetic field detectors. The interior cavity (shown as reference numeral 28 in FIG. 2) is shown having a rectangularly-shaped cross-section (shown as reference numeral 38 in FIG. 2). This rectangular cross-section is adapted to slide onto the rectangularly-shaped housing (shown as reference numeral 14 in FIG. 1). The interior cavity, however, may have any desired cross-sectional shape that slides over and onto the housing. The interior cavity, in fact, may have any desired cross-sectional shape that slides onto any tool or equipment. While this invention is discussed with reference to voltage detectors, this invention is equally applicable to all electrical and voice/data/video testing equipment. The interior cavity may have cross-sectional shape that slides onto any equipment.

While the present invention has been described with respect to various features, aspects, and embodiments, those skilled and unskilled in the art will recognize the invention is not so limited. Other variations, modifications, and alternative embodiments may be made without departing from the spirit and scope of the present invention.

What is claimed is:

1. An apparatus, comprising:
   a main body having a first end, a second end, and an interior cavity, the interior cavity open at the first end and extending into an entirely hollow interior region of the main body, the interior cavity bound by a side wall and terminating within the main body at an end wall; and
   a frustoconical extension outwardly extending from the second end of the main body, the extension having a convex outer surface profile that tapers from a major diameter at the second end to a 216-Type can wrench at a minor diameter, the 216-Type can wrench having a thin-walled, polygonally-shaped interior cross-section.

2. An apparatus according to claim 1, wherein the polygonally-shaped interior cross-section of the 216-Type can wrench has a nominal diameter of ⅜-inch.

3. An apparatus according to claim 1, wherein the polygonally-shaped interior cross-section of the 216-Type can wrench has a nominal diameter of ⁷⁄₁₆-inch.

4. An apparatus according to claim 1, wherein the outer surface of the frustoconical extension has a polygonally-shaped exterior cross-section that inwardly tapers in size to the 216-Type can wrench.

5. An apparatus according to claim 1, wherein the outer surface of the frustoconical extension has a hexagonally-shaped exterior cross-section that inwardly tapers in size to the 216-Type can wrench, the can wrench also having a hexagonally-shaped exterior cross-section and a smoothly bored interior cross section.

6. An apparatus, comprising:
   a main body having a first end, a second end, and an interior cavity, the interior cavity entirely open at the first end and extending into an entirely hollow interior region of the main body, the interior cavity bound by a side wall and terminating within the main body at an end wall; and a frustoconical extension outwardly extending from the second end of the main body, the extension having a convex outer surface profile that tapers from a major diameter at the second end to a security wrench at a minor diameter, the security wrench for engaging a fastener.

7. An apparatus according to claim 6, wherein the security wrench comprises a hexagonally-shaped exterior surface.

8. An apparatus according to claim 7, wherein the security wrench comprises a smoothly bored interior cross section.

9. An apparatus according to claim 7, wherein the security wrench comprises a polygonally-shaped interior cross section.

* * * * *